United States Patent
Xiong et al.

(10) Patent No.: US 10,419,024 B2
(45) Date of Patent: Sep. 17, 2019

(54) EARLY TERMINATION OF LOW-DENSITY PARITY-CHECK (LDPC) DECODING

(71) Applicant: SK Hynix Inc., Gyeonggi-do (KR)

(72) Inventors: Chenrong Xiong, San Jose, CA (US); Fan Zhang, Fremont, CA (US); Yu Cai, San Jose, CA (US); Aman Bhatia, San Jose, CA (US); Naveen Kumar, San Jose, CA (US); Abhiram Prabahkar, San Jose, CA (US)

(73) Assignee: SK Hynix Inc., Gyeonggi-do (KR)

( * ) Notice: Subject to any disclaimer, the term of this patent is extended or adjusted under 35 U.S.C. 154(b) by 83 days.

(21) Appl. No.: 15/607,260

(22) Filed: May 26, 2017

(65) Prior Publication Data

US 2018/0343082 A1     Nov. 29, 2018

(51) Int. Cl.
*H03M 13/11* (2006.01)
*H04L 1/00* (2006.01)
(Continued)

(52) U.S. Cl.
CPC .... *H03M 13/1108* (2013.01); *H03M 13/1128* (2013.01); *H04L 1/0051* (2013.01); *H04L 1/0057* (2013.01); *H03M 13/05* (2013.01); *H03M 13/1111* (2013.01); *H03M 13/1575* (2013.01); *H03M 13/255* (2013.01); *H03M 13/2948* (2013.01); *H03M 13/2951* (2013.01); *H03M 13/3746* (2013.01); *H03M 13/3753* (2013.01); *H03M 13/458* (2013.01); *H03M 13/616* (2013.01); *H04L 1/005* (2013.01)

(58) Field of Classification Search
CPC ............... H04L 1/005; H03M 13/1111; H03M 13/1108; H03M 13/3746; H03M 13/2948; H03M 13/1575; H03M 13/458; H03M 13/45; H03M 13/255; H03M 13/3753; H03M 13/05; H03M 13/2951; H03M 13/616
See application file for complete search history.

(56) References Cited

U.S. PATENT DOCUMENTS

| 8,527,843 B2 | 9/2013 | Ramesh et al. |
| 8,839,077 B2 | 9/2014 | Ueng et al. |

(Continued)

*Primary Examiner* — April Y Blair
*Assistant Examiner* — Sazzad Hossain
(74) *Attorney, Agent, or Firm* — Kilpatrick Townsend & Stockton LLP (57) ABSTRACT

Techniques for improving the latency or processing performance of an error correction system are described. In an example, the error correction system implements LDPC decoding and uses an early termination rule to determine whether the LDPC decoding should be terminated prior to reaching a maximum number of iterations. The early termination rule involves various parameters that relate to the syndrome of the decoded LDPC codeword at each iteration. These parameters include the number of the current decoding iteration and the weight of the syndrome at the current iteration. For example, the early termination rule specifies that the LDPC decoding should be terminated prior to the maximum number of iterations either when the weight of the syndrome is zero, or when the current number of iterations reaches an iteration number threshold and the weight of the syndrome equals or exceeds a checksum threshold.

20 Claims, 8 Drawing Sheets

(51) Int. Cl.
    *H03M 13/29*     (2006.01)
    *H03M 13/37*     (2006.01)
    *H03M 13/45*     (2006.01)
    *H03M 13/05*     (2006.01)
    *H03M 13/25*     (2006.01)
    *H03M 13/00*     (2006.01)
    *H03M 13/15*     (2006.01)

(56) References Cited

U.S. PATENT DOCUMENTS

| | | | | |
|---|---|---|---|---|
| 2007/0043998 | A1* | 2/2007 | Lakkis | H03M 13/1137 |
| | | | | 714/758 |
| 2014/0122962 | A1* | 5/2014 | Kodavalla | H03M 13/3746 |
| | | | | 714/755 |
| 2014/0168811 | A1* | 6/2014 | Yang | H03M 13/1111 |
| | | | | 360/53 |
| 2015/0279421 | A1* | 10/2015 | Wilson | G11B 20/10509 |
| | | | | 360/65 |
| 2016/0249234 | A1* | 8/2016 | Zhang | H04W 24/02 |
| 2018/0034477 | A1* | 2/2018 | Zamir | G11C 16/08 |

* cited by examiner

FIG. 1

$$200 \quad H = \begin{bmatrix} 1 & 0 & 1 & 0 & 0 & 1 \\ 1 & 1 & 0 & 0 & 1 & 0 \\ 1 & 0 & 0 & 1 & 0 & 0 \\ 0 & 1 & 0 & 1 & 0 & 1 \end{bmatrix}$$

FIG. 2A

Variable Nodes    Check Nodes

EARLY TERMINATION OF LOW-DENSITY PARITY-CHECK (LDPC) DECODING

CROSS-REFERENCES TO RELATED APPLICATIONS

Not Applicable

STATEMENT AS TO RIGHTS TO INVENTIONS MADE UNDER FEDERALLY SPONSORED RESEARCH AND DEVELOPMENT

Not Applicable

REFERENCE TO A "SEQUENCE LISTING," A TABLE, OR A COMPUTER PROGRAM LISTING APPENDIX SUBMITTED ON A COMPACT DISK

Not Applicable

BACKGROUND

Data integrity is an important feature for any data storage device and data transmission. Use of strong error-correction codes (ECCs) is recommended for various types of data storage devices include NAND flash memory devices. ECCs are also frequently used during the process of data transmission.

Error correcting code (ECC) refers to codes that add redundant data, or parity data, to a message, such that the message can be recovered by a receiver even when a number of errors were introduced, either during the process of transmission, or storage. In general, the ECC can correct the errors up to the capability of the code being used.

Low-density parity-check (LDPC) codes are an example of ECC. Generally, an LDPC decoder uses an iterative decoding process to decode information bits. The iterative decoding consumes time and levies a processing burden. Typically, the time and processing burden increase with an increase to the number of performed iterations. In certain latency sensitive applications (e.g., where the decoding should be completed within a short time period) and/or processing sensitive applications (e.g., where the decoding should use a small amount of processing), existing iterative decoding processes of LDPC codes may not be able to meet the desired latency and/or processing performance.

BRIEF SUMMARY

Techniques for improving the latency or processing performance of an error correction system are described. In an example, a system includes an LDPC decoder and initiates an iterative decoding of an LDPC codeword. Generally, the iterative decoding is bounded by a maximum number of iterations. The system determines that a current iteration of the iterative decoding corresponds to number of iterations that is equal to or greater than an iteration number threshold and is smaller than the maximum number of iterations. The system compares a weight of a syndrome of the LDPC codeword at the current number of iterations to a checksum threshold. This comparison may be performed when the syndrome is non-zero. The system terminates the iterative decoding based on the comparing. The iterative decoding is terminated prior to reaching the maximum number of iterations.

These illustrative examples are mentioned not to limit or define the disclosure, but to provide examples to aid understanding thereof. Additional embodiments and examples are discussed in the Detailed Description, and further description is provided there.

BRIEF DESCRIPTION OF THE DRAWINGS

An understanding of the nature and advantages of various embodiments may be realized by reference to the following figures. In the appended figures, similar components or features may have the same reference label. Further, various components of the same type may be distinguished by following the reference label by a dash and a second label that distinguishes among the similar components. If only the first reference label is used in the specification, the description is applicable to any one of the similar components having the same first reference label irrespective of the second reference label.

DETAILED DESCRIPTION

Generally, LDPC decoding uses an iterative decoding process. The iterative decoding process ends based on two parameters. First, if a syndrome of a decoded codeword is zero, the iterative decoding for that codeword is terminated. The syndrome is zero when all errors, if any were existent, have been corrected by the LDPC decoder. Second, if the syndrome is not zero, but the number of iterations reaches a maximum number, the iterative decoding ends. This scenario occurs when the iterative decoding does not correct all the errors. Under this scenario, the iterative decoding is repeated until the maximum number of iterations regardless of information that the non-zero syndrome may reveal. Because the iterative decoding is "blindly" repeated until the maximum number of iterations, its overall latency and processing performance directly depends on this maximum number. The larger the maximum number is, the worse the latency and processing burden can become.

To improve the latency and processing performance, embodiments of the present disclosure are directed to an early termination of LDPC decoding. In an example, a set of additional parameters is introduced to terminate the iterative decoding procedure prior to reaching the maximum number of iterations. This set relates to information that the non-zero syndrome reveals about the decoding. The weight of the non-zero syndrome represents the checksum of the codeword. If after a certain number of iterations, the non-zero weight of the syndrome is too large, that large weight indicates that the likelihood of correcting all the errors of the codeword is low, even if the maximum number of iterations is performed. In another illustration, if the change to the weight of the syndrome between the iterations indicates that the weight is not properly improving (e.g., its value is not zero and is increasing, staying constant or relatively stable, or not decreasing at an acceptable decrease rate), the likelihood of correcting all the errors of the codeword is also low, even if the maximum number of iterations is performed. Hence, under these two scenarios, terminating the iterative decoding prior to reaching the maximum number of iterations is advantageous because the early termination improves the latency and reduces the processing burden without a significant degradation, if any, to the correction capability of the iterative decoding (e.g., to the bit error rate (BER) performance).

Hence, various embodiments of the present disclosure involve the use of the additional set parameter for the early termination of the iterative decoding procedure. In an example, this set includes the number of iterations and the weight of the syndrome. More specifically, the number of iterations is monitored. When the number for a current iteration reaches an iteration number threshold that is smaller than the maximum number of iterations, the weight of the non-zero syndrome is compared to a checksum threshold. If the comparison indicates that the weight of non-zero syndrome at the current iteration is greater than the checksum threshold, the likelihood of correcting all the errors of the codeword is low even if subsequent iterations are performed up to the maximum number of iterations. Accordingly, the iterative decoding is terminated at the current iteration. On the other hand, if the comparison indicates that the weight of the non-zero syndrome at the current iteration is smaller than the checksum threshold, one or more of the subsequent iterations are performed.

In the interest of clarity of explanation, the embodiments of the present disclosure are described in connection with LDPC decoding. However, the embodiments are not limited as such and apply to other decoding procedures that rely on the syndrome of a codeword.

Figure 1:
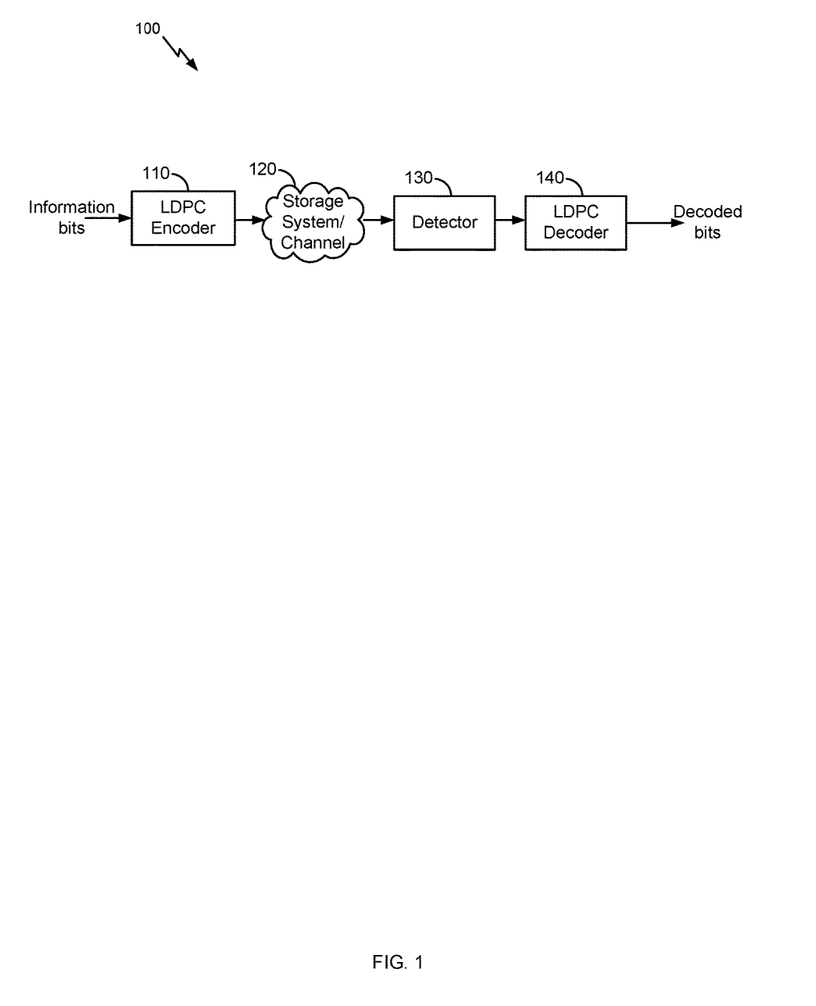
FIG. 1 illustrates an example high level block diagram of an error correcting system, in accordance with certain embodiments of the present disclosure.

FIG. 1 illustrates an example high level block diagram of an error correcting system 100, in accordance with certain embodiments of the present disclosure. In the example, LDPC codes are described in connection with data storage. However, the embodiments of the present disclosure are not limited as such. Instead, the embodiments similarly apply to other usage of LDPC codes including, for example, data transmission.

LDPC codes are linear block codes defined by a sparse parity-check matrix H, which consists of zeros and ones. The term "sparse matrix" is used herein to refer to a matrix in which a number of non-zero values in each column and each row is much less than its dimension. The term "column weight" is used herein to refer to the number of non-zero values in a specific column of the parity-check matrix H. The term "row weight" is used herein to refer to number of non-zero values in a specific row of the parity-check matrix H. In general, if column weights of all of the columns in a parity-check matrix corresponding to an LDPC code are similar, the code is referred to as a "regular" LDPC code. On the other hand, an LDPC code is called "irregular" if at least one of the column weights is different from other column weights. Usually, irregular LDPC codes provide better error correction capability than regular LDPC codes.

The LDPC codes are also described according to the way they are constructed. Random computer searches or algebraic constructions are possible. The random computer search construction describes an LDPC code having a parity-check matrix designed by a random computer-based procedure. Algebraic construction implies that the parity-check matrix has been constructed based on combinatorial methods. Quasi-cyclic LDPC (QC-LDPC) codes fall under the latter construction method. One advantage of QC-LDPC codes is that they have a relatively easier implementation in terms of the encoding procedure. The main feature of QC-LDPC codes is that the parity-check matrix consists of circulant submatrices, which could be either based on an identity matrix or a smaller random matrix. Permutation vectors could also be used in order to create the circulant submatrices.

As illustrated, an LDPC encoder 110 receives information bits that include data which is desired to be stored in a storage system 120. LDPC encoded data is output by the LDPC encoder 110 and is written to the storage 120.

In various embodiments, the storage 120 may include a variety of storage types or media such as (e.g., magnetic) disk drive storage, flash storage, etc. In some embodiments, the techniques are employed in a transceiver and instead of being written to or read from storage, the data is transmitted and received over a wired and/or wireless channel. In this case, the errors in the received codeword may be introduced during transmission of the codeword.

When the stored data is requested or otherwise desired (e.g., by an application or user which stored the data), a detector 130 receives data from the storage system 120. The received data may include some noise or errors. The detector 130 performs detection on the received data and outputs decision and/or reliability information. For example, a soft output detector outputs reliability information and a decision for each detected bit. On the other hand, a hard output detector outputs a decision on each bit without providing corresponding reliability information. As an example, a hard output detector may output a decision that a particular bit is a "1" or a "0" without indicating how certain or sure the detector is in that decision. In contrast, a soft output detector outputs a decision and reliability information associated with the decision. In general, a reliability value indicates how certain the detector is in a given decision. In one example, a soft output detector outputs a log-likelihood ratio (LLR) where the sign indicates the decision (e.g., a positive value corresponds to a "1" decision and a negative value corresponds to a "0" decision) and the magnitude indicates how sure or certain the detector is in that decision (e.g., a large magnitude indicates a high reliability or certainty).

The decision and/or reliability information is passed to a LDPC decoder 140 which performs LDPC decoding using the decision and reliability information. A soft input decoder utilizes both the decision and the reliability information to decode the codeword. A hard decoder utilizes only the decision values in the decoder to decode the codeword. The decoded bits generated by the LDPC decoder 140 are passed to the appropriate entity (e.g., the user or application which requested it). With proper encoding and decoding, the information bits match the decoded bits.

In various embodiments, the system shown may be implemented using a variety of techniques including an application-specific integrated circuit (ASIC), a field-programmable gate array (FPGA), and/or a general purpose processor (e.g., an Advanced RISC Machine (ARM) core).

LDPC codes are usually represented by bipartite graphs. One set of nodes, the variable or bit nodes correspond to elements of the code word and the other set of nodes, e.g., check nodes, correspond to the set of parity-check constraints satisfied by the code words. Typically the edge connections are chosen at random. The error correction capability of an LDPC code is improved if cycles of short length are avoided in the graph. In a (r,c) regular code, each of the n variable nodes (V1, V2, ..., Vn) has connections to r check nodes and each of the m check nodes (C1, C2, ..., Cm) has connections to c bit nodes. In an irregular LDPC code, the check node degree is not uniform. Similarly the variable node degree is not uniform. In QC-LDPC codes, the parity-check matrix H is structured into blocks of p×p matrices such that a bit in a block participates in only one check equation in the block, and each check equation in the block involves only one bit from the block. In QC-LDPC codes, a cyclic shift of a code word by p results in another code word. Here p is the size of square matrix which is either a zero matrix or a circulant matrix. This is a generalization of a cyclic code in which a cyclic shift of a code word by 1 results in another code word. The block of p×p matrix can be a zero matrix or cyclically shifted identity matrix of size p×p.

Figure 2A:
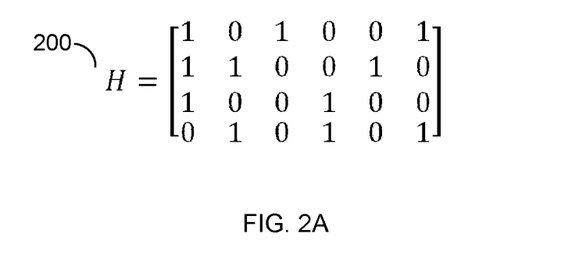
FIG. 2A-2B illustrate an example parity-check matrix and an example graph representing the parity-check matrix, in accordance with certain embodiments of the present disclosure.
Figure 2B:
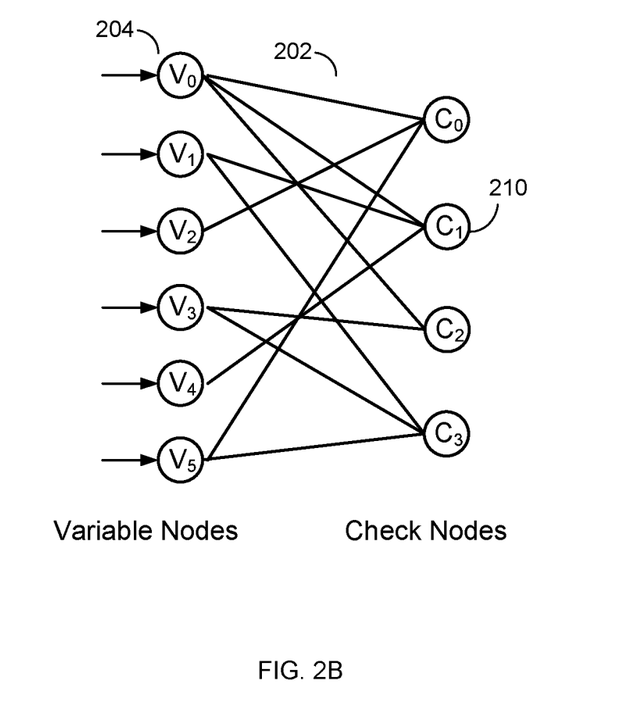

FIG. 2A illustrates an example parity-check matrix H 200 and FIG. 2B illustrates an example bipartite graph corresponding to the parity-check matrix 200, in accordance with certain embodiments of the present disclosure. In this example, the parity-check matrix 200 has six column vectors and four row vectors. Network 202 shows the network corresponding to the parity-check matrix 200 and represent a bipartite graph. Various type of bipartite graphs are possible, including, for example, a Tanner graph.

Generally, the variable nodes in the network 202 correspond to the column vectors in the parity-check matrix 200. The check nodes in the network 202 correspond to the row vectors of the parity-check matrix 200. The interconnections between the nodes are determined by the values of the parity-check matrix 200. Specifically, a "1" indicates the corresponding check node and variable nodes have a connection. A "0" indicates there is no connection. For example, the "1" in the leftmost column vector and the second row vector from the top in the parity-check matrix 200 corresponds to the connection between the variable node 204 and the check node 210.

A message passing algorithm is generally used to decode LDPC codes. Several variations of the message passing algorithm exist in the art, such as min-sum algorithm, scaled min-sum algorithm or the like. In general, any of the variations of the message passing algorithm may be used in an LDPC decoder without departing from the teachings of the present disclosure. Message passing uses a network of variable nodes and check nodes, as shown in FIG. 2B. The connections between variable nodes and check nodes are described by and correspond to the values of the parity-check matrix 200, as shown in FIG. 2A.

A hard decision message passing algorithm may be performed. In a first step, each of the variable nodes sends a message to one or more check nodes that are connected to it. In this case, the message is a value that each of the variable nodes believes to be its correct value.

In the second step, each of the check nodes calculates a response to send to the variable nodes that are connected to it using the information that it previously received from the variable nodes. The response message corresponds to a value that the check node believes that the variable node should have based on the information received from the other variable nodes connected to that check node. This response is calculated using the parity-check equations which force the values of all the variable nodes that are connected to a particular check node to sum up to zero (modulo 2).

At this point, if all the equations at all the check nodes are satisfied, the decoding algorithm declares that a correct codeword is found and it terminates. If a correct codeword is not found, the iterations continue with another update from the variable nodes using the messages that they received from the check nodes to decide if the bit at their position should be a zero or a one by a majority rule. The variable nodes then send this hard decision message to the check nodes that are connected to them. The iterations continue until a correct codeword is found, a certain number of iterations are performed depending on the syndrome of the codeword (e.g., of the decoded codeword), or a maximum number of iterations are performed without finding a correct codeword as further illustrated in the next figures. It should be noted that a soft-decision decoder works similarly, however, each of the messages that are passed among check nodes and variable nodes, also include reliability of each bit.

An example message passing algorithm may be performed. In this example, $L(q_{ij})$ represents a message that is sent by variable node $v_i$ to check node $c_j$; $L(r_{ji})$ represents the message sent by check node $c_j$ to variable node $v_i$; and $(L(c_i)$ represents initial LLR value for each variable node $v_i$. Variable node processing for each $L(q_{ij})$ can be done through the following steps:

(1) Read $L(c_i)$ and $L(r_{ji})$ from memory.

(2) Calculate $L(Q_{i}\text{-sum}) = L(c_i) + \text{Scaling Factor} * \sum_{j \in c_i} L(r_{ij})$.

(3) Calculate each $L(Q_{i}\text{-sum}) - L(r_{ij})$.

(4) Output $L(Q_{i}\text{-sum})$ and write back to memory.

(5) If this is not the last column of the memory, go to Step 1 and increment i by one.

(6) Compute parity-check-sums (e.g., syndrome), if they are all equal to zero, the number of iterations reaches a threshold and the parity-check-sums are greater than another threshold, or the number of iterations equals a maximum limit, stop; otherwise, perform check node processing.

Check node processing for each $L(r_{ji})$ can be performed as follows:

(1) Read one row of $q_{ij}$ from memory.

(2) Calculate $L(R_j\text{-sum})$ as follows:

$$L(Rj - sum) = \left(\prod_{i' \in R_j} \alpha_{i'j}\right) \phi\left(\sum_{i' \in R_j} \phi(\beta_{i'j})\right)$$

$$\alpha_{ij} = \text{sign}(L(q_{ij})), \beta_{ij} = |L(q_{ij})|,$$

$$\phi(x) = -\log\left(\tanh\left(\frac{x}{2}\right)\right) = \log\left(\frac{e^x + 1}{e^x - 1}\right)$$

(3) Calculate the individual $L(r_{ji}) = (\prod_{i' \in R_{ji}} \alpha_{i'j}) \phi(\sum_{i' \in R_{ji}} \phi(\beta_{i'j}))$ for check nodes.

(4) Write back $L(r_{ji})$ to memory.

(5) If this is not the last row of memory, then go to the first step and increment j by one.

Figure 3:
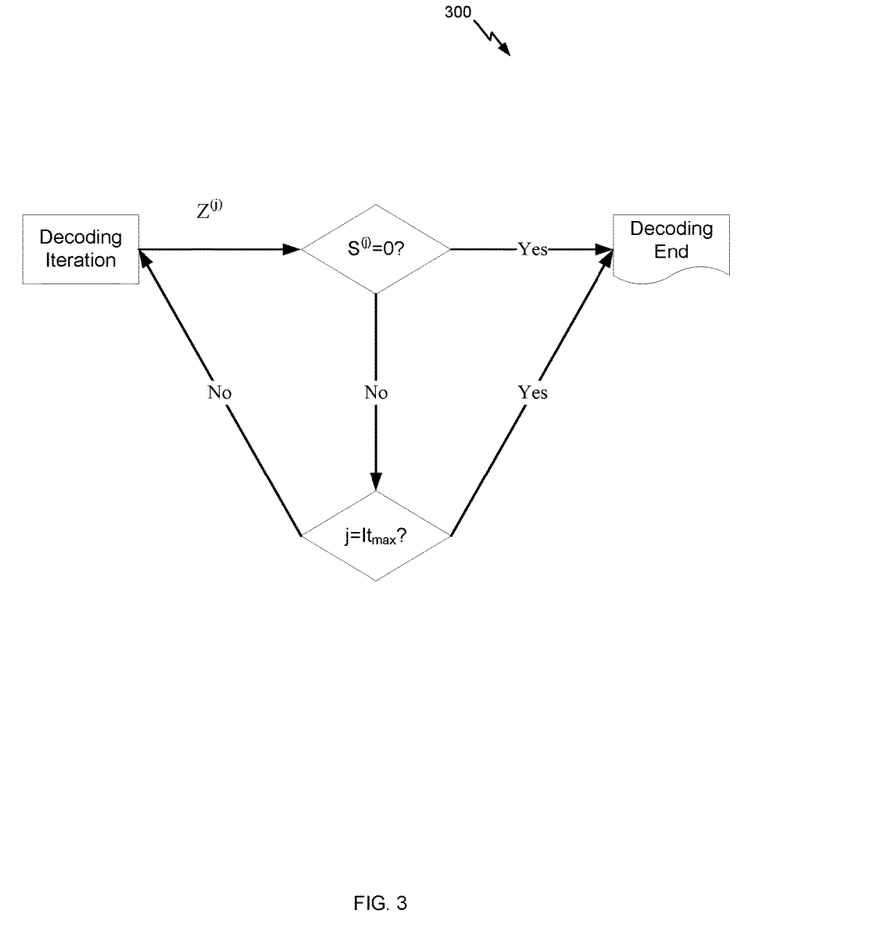
FIG. 3 illustrates an example diagram for terminating an LDPC iterative decoding based on a syndrome and maximum number of iterations, in accordance with certain embodiments of the present disclosure.

FIG. 3 illustrates an example diagram 300 for terminating an LDPC iterative decoding based on a syndrome and maximum number of iterations, in accordance with certain embodiments of the present disclosure. The termination depends on either the syndrome of a codeword being a zero or the number of iterations reaching the maximum number.

As illustrated in diagram 300, suppose that $x=[x_0, x_1, \ldots, x_{N-1}]$ is a bit vector, and $H=[h_{i,j}]$ is an M×N low-density parity-check matrix with a binary value at the intersection of row i and column j. Then each row of H provides a parity check for x. If x is a codeword of H, $xH^T=0$ because of the LDPC code construction. Assume that x is transmitted over a noisy channel, and the corrupted channel output is $y=[y_0, y_1, \ldots, y_{N-1}]$ and its hard decision is $z=[z_0, z_1, \ldots, z_{N-1}]$. The syndrome of z is a binary vector calculated by $s=[s_0, s_1, \ldots, s_{N-1}]=zH^T$, with a weight of $\|s\|$. The weight of $\|s\|$ represents the number of unsatisfied check nodes and is also called the checksum since $\|s\|=\Sigma_{i=0}^{M-1} s_i$. Suppose that $z^{(j)}=[z_0, z_1, \ldots, z_{N-1}]$ is the hard decision of the j-th iteration and the syndrome vector of the j-th iteration is $s^{(j)}=[s_0^{(j)}, s_1^{(j)}, \ldots, s_{N-1}^{(j)}]=z^{(j)}H^T$. Then $\|s\|^{(j)}$ is the checksum of the j-th iteration.

As further illustrated in diagram 300, the iterative decoding is terminated either when the checksum is zero (shown with $s^{(j)}=0$), or when the checksum is non-zero and the iteration number reaches the predefined maximal iteration number (shown with $j=It_{max}$, where "$It_{max}$" is the maximum number of iterations). Otherwise, the iterative decoding is repeated.

Figure 4:
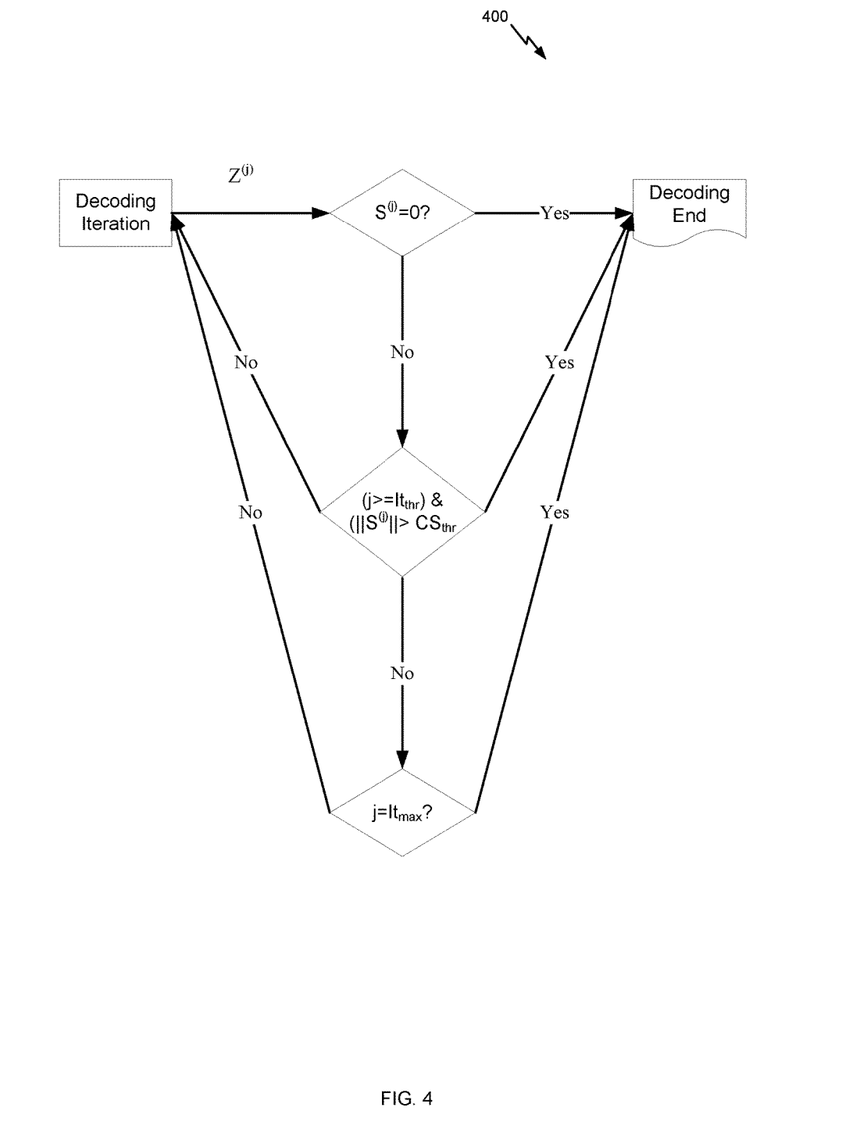
FIG. 4 illustrates an example diagram for early terminating an LDPC iterative decoding based on a current number of iterations and the syndrome at the current iteration, in accordance with certain embodiments of the present disclosure.

FIG. 4 illustrates an example diagram 400 for early terminating an LDPC iterative decoding based on a current number of iterations and the syndrome at the current iteration, in accordance with certain embodiments of the present disclosure. The termination of diagram 400 introduces an additional set of parameters: the iterative decoding is terminated prior to reaching the maximum number depending on the current iteration reaching a threshold iteration number and the information about the syndrome at the current iteration (e.g., the weight of the syndrome) being greater than a checksum threshold.

In an example, to reduce the average iteration number, two additional parameters are used. "$It_{thr}$" is defined as an iteration number threshold and "$CS_{thr}$" is defined as a checksum threshold. These two new parameters can be used to define an early termination rule for decoding termination, where this rule accounts also for a zero-syndrome and the maximum number of iterations "$It_{max}$" For instance, according to the early termination rule, the decoding algorithm is terminated either when the checksum is zero (shown with $s^{(j)}=0$), when the current number of iterations reaches the iteration number threshold and the weight of the syndrome (or, similarly, the checksum of the codeword) equals or exceeds the checksum threshold (shown as $j \geq It_{thr}$ and $\|s\|^{(j)} > CS_{thr}$), or when the maximum iteration number is reached.

Figure 5:
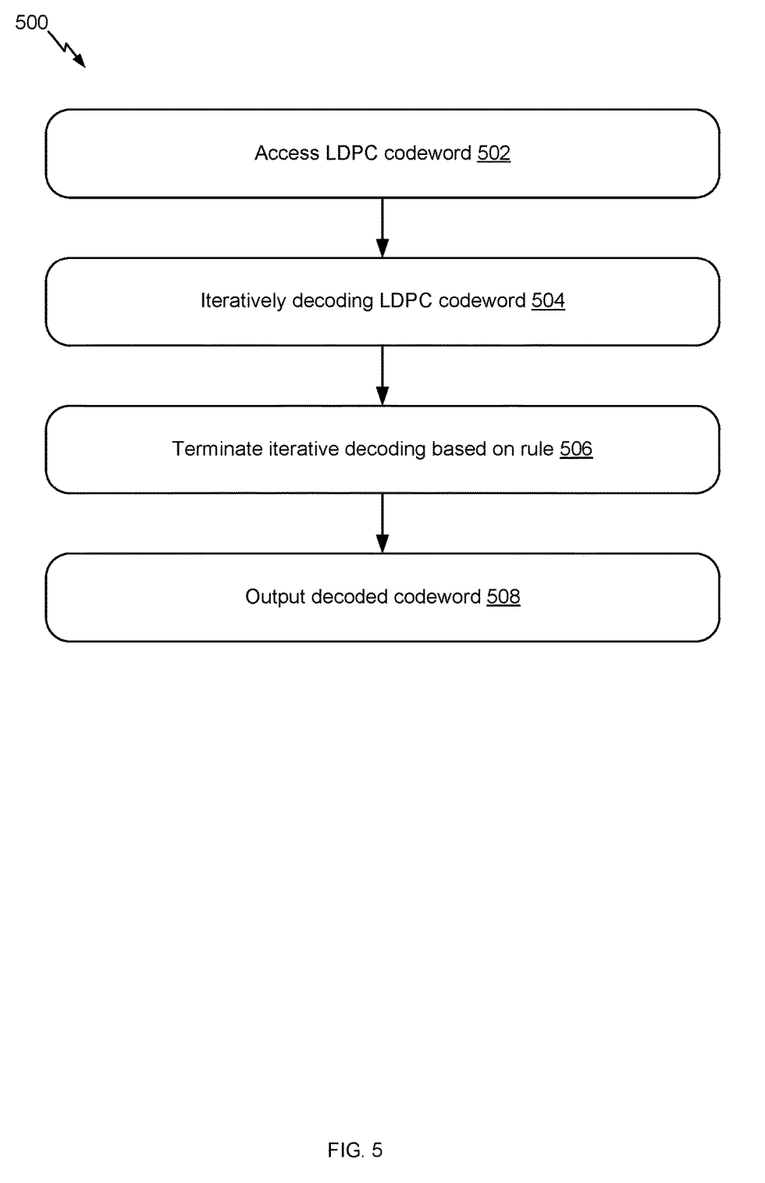
FIG. 5 illustrates an example flow for an LDPC iterative decoding, in accordance with certain embodiments of the present disclosure.
Figure 6:
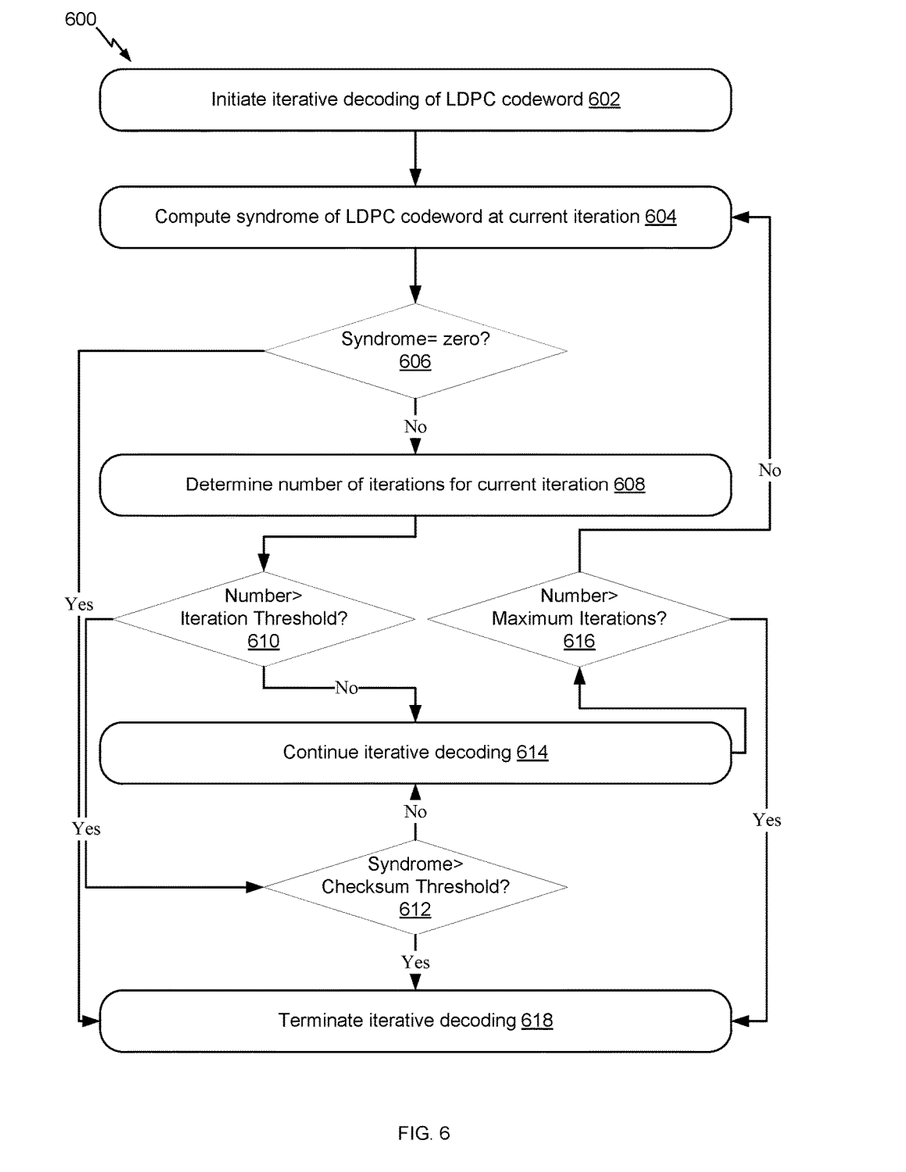
FIG. 6 illustrates an example flow for early termination of an LDPC iterative decoding based on a current number of iterations and the syndrome at the current iteration, in accordance with certain embodiments of the present disclosure.
Figure 7:
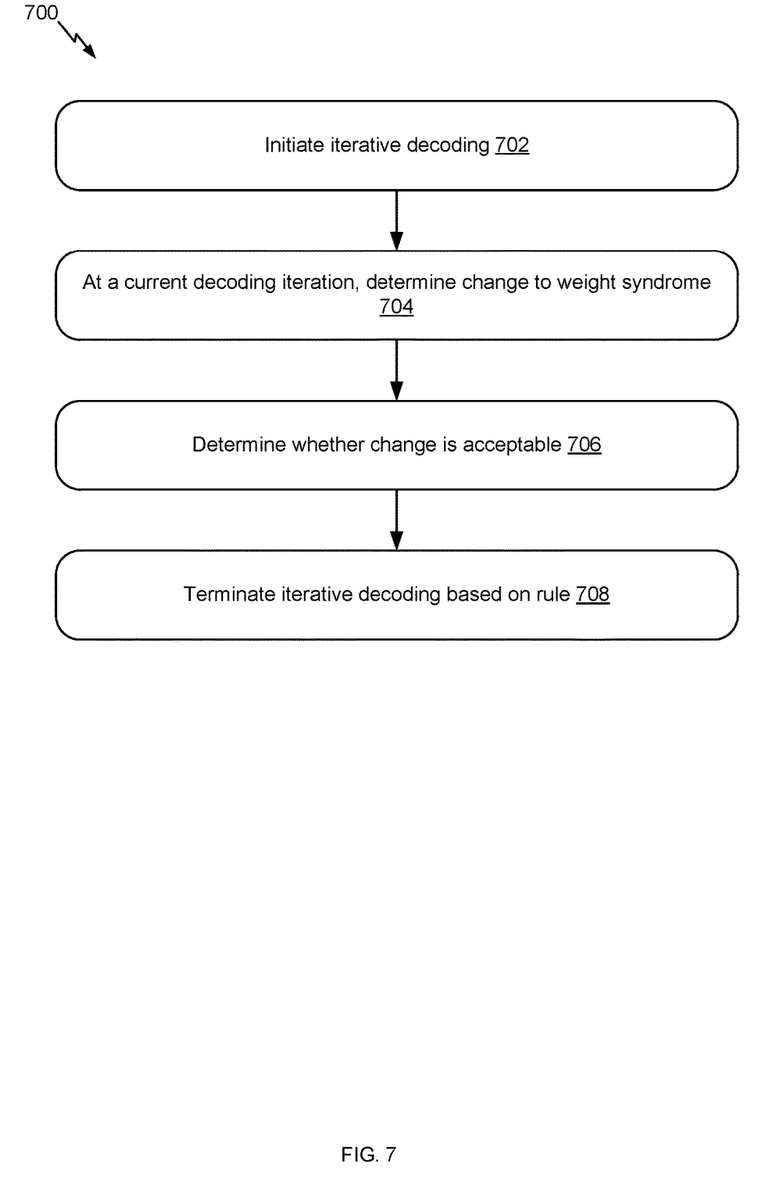
FIG. 7 illustrates an example flow for using the syndrome at the current iteration to generate a decision for an early termination of an LDPC iterative decoding, in accordance with certain embodiments of the present disclosure.

FIGS. 5-7 illustrate example flows for decoding a codeword, such as an LDPC codeword, based on an iterative decoding process that uses an early termination rule, where this rule applies parameters that relate to the syndrome of the decoded codeword. A system is described as performing particular operations of the example flows. In particular, the system implements an error correcting system, such as the error correcting system 100 of FIG. 1. The system may have a specific hardware configuration to perform the operations of the error correcting system, including those of a decoder (e.g., an iterative decoder such as the LDPC decoder 140 of FIG. 1). Alternatively or additionally, the system may include generic hardware configured with specific instructions. In an example, the system includes one or more processors and one or more memories. The memory(ies) stores computer-readable instructions to embody functionalities specific to the system. The instructions, when executed by the processor(s) of the system, result in performance of the functionalities by the system. The instructions stored in the memory(ies) in conjunction with the underlying processor(s) represent means for performing the functionalities. Some of the operations across the example flows are similar. In the interest of brevity, the similarities are not repeated herein. Further, although the operations are illustrated in a particular order, other arrangement of the operations are possible and some of the operations may be skipped as it would be apparent to a person skilled in the art.

FIG. 5 illustrates an example flow 500 for an LDPC iterative decoding, in accordance with certain embodiments of the present disclosure. As illustrated, the example flow 500 starts at operation 502, where the system accesses an LDPC codeword. For example, the LDPC codeword is accessed from storage in response to a request for information bits stored in the storage. The information bits were encoded using an LDPC encoding process and stored in the storage.

At operation 504, the system iteratively decodes the LDPC codeword. For example, the system implements a hard or soft iterative LDPC decoding process and inputs the LDPC codeword to such a process. The iterative decoding process, whether soft or hard, monitors the number of iterations, computes the syndrome of the LDPC codeword (e.g., of the decoded codeword), and applies the early termination rule based on the syndrome and the number of iterations to either continue the iterative decoding or to terminate this decoding early prior to reaching the maximum number of iterations. These and other operations related to the early termination are further described in connection with the next figures.

At operation 506, the system terminates the iterative decoding early (e.g., prior to reaching the maximum number of iterations) based on the early termination rule. In an example this rule includes various parameters that control the early termination prior to reaching the maximum number of iterations. One of the parameters is whether the syndrome is zero or not. If the syndrome is zero, the early termination rule specifies that the iterative decoding should stop at the current iteration. If the syndrome is non-zero, the system checks additional parameters.

One of the additional parameters is the current number of iterations. Another additional parameter is the weight of the syndrome. If the current number of iterations is less than an iteration number threshold, the iterative decoding proceeds to the next decoding iteration. In contrast, if the current number of iterations is equal to or greater than the iteration number threshold, the system checks the weight of the syndrome.

Various types of checks are possible (each of which may define an additional parameter). One example check compares the weight of the syndrome at the current iteration (e.g., the current value of this weight, or similarly, the current checksum of the decoded codeword at the current decoding iteration) and a checksum threshold (e.g., the weight is compared to the checksum threshold). If the comparison indicates that the weight is equal to or greater than the checksum threshold, the system terminates the iterative decoding at the current iteration. That is because the comparison indicates that the weight of the syndrome is too large such that the likelihood of correcting all the errors of the codeword is low even if the maximum number of iterations is performed. Otherwise, the iterative decoding proceeds to the next decoding iteration.

Another example check monitors the change to the weight of the syndrome from a number of previous decoding iterations (five, or half way from (or some other fraction or function) the current iteration to the maximum number of iterations) the start of the iterative decoding). If the change indicates that the weight is relatively stable (e.g., changes within a predefined weight range such as +/−1), is constant, is not improving (e.g., is worsening by increasing instead of decreasing), or is less than a predefined change rate threshold, the system terminates the iterative decoding at the current iteration. That is because the rate of change to the weight of the syndrome indicates that no significant BER gains are likely to be achieved even if the maximum number of iterations is performed. Otherwise, the iterative decoding proceeds to the next decoding iteration Of course, concurrent use of both types of checks is possible. For example, once the number of iterations reaches the iteration number threshold, the system compares the weight of the syndrome at the current iteration to the checksum threshold. If the weight is equal to or greater than the checksum threshold, the system starts monitoring the change to the weight of the syndrome over a next number of iterations to determine whether to terminate the iterative decoding at any of the subsequent decoding iterations but prior to reaching the maximum number of iterations (e.g., depending on whether the change indicates that the weight is relatively stable, is constant, is not improving, or is less than a predefined change rate threshold such as the weight decreasing by three (or some other values) between each iteration). This next number of iterations can be predefined (e.g., five, or half way from (or some other fraction or function) the current iteration to the maximum number of iterations)).

In an example, the various parametric values are predefined based on a simulation of the latency performance and/or processing performance of the system (or of the LDPC decoder). Generally, the simulation varies the different parametric values. The parametric values resulting in the best or desired latency performance and/or processing performance are stored in the memory of the system. As described herein above, these parameter values include the iteration number threshold, the checksum threshold, the change rate threshold, the number of previous decoding iterations, the number of additional decoding iterations, the weight range, and the maximum number of iterations. In an illustrative example, the maximum number of iterations is in the range of fifteen to twenty-five, the iteration number threshold is smaller than the maximum number of iterations and is in the range of ten to twenty, and checksum threshold is in the range of twenty-five to thirty-five. In another illustrative example, the iteration number threshold is in the range of sixty to eighty percent of the maximum number of iterations.

At operation 508, the system outputs the decoded codeword. For example, upon termination of the iterative decoding process, the system determines the decoded information bits and outputs these information bits as being representative of the originally encoded and stored information bits.

FIG. 6 illustrates an example flow 600 for early termination of an LDPC iterative decoding based on a current number of iterations and the syndrome at the current iteration, in accordance with certain embodiments of the present disclosure. Some or all of the operations of example flow 600 may be implemented as sub-operations of operations 504 and 506 of the example flow 500 of FIG. 5.

As illustrated, the example flow 600 starts at operation 602, where the system initiates an iterative decoding of an LDPC codeword. In an example, the iterative decoding is bounded by a maximum number of iterations. The system starts with the first iteration and sets an iteration counter to one. The iterative decoding uses soft or hard decoding.

At operation 604, the system computes a syndrome associated the LDPC codeword at a current iteration. This syndrome corresponds to the checksum of the decoded LDPC codeword at the current iteration. The current iteration is the first iteration when operation 604 is performed for the first time after the initiation of the iterative decoding at operation 602. Otherwise, the current iteration is the latest iteration through which the system is decoding the LDPC codeword. In an example, x is a codeword of H and $xH^T=0$ because of the LDPC code construction. The LDPC codeword under decoding is $y=[y_0, y_1, \ldots, y_{N-1}]$ and is different than because of x channel noise. In the current iteration, the system decodes y hard decision is $z=[z_0, z_1, \ldots, z_{N-1}]$. The system computes the syndrome of z as a binary vector calculated by $s=[s_0, s_1, \ldots, s_{N-1}]=zH^T$. The system also computes the weight of s as $\|s\|$. $z^{(j)}=[z_0, z_1, \ldots, z_{N-1}]$ is the hard decision of the j-th iteration (the current iteration) and the syndrome vector of the j-th iteration is $s^{(j)}=[s_0^{(j)}, s_1^{(j)}, \ldots, s_N^{(j)}]=z^{(j)}H^T$. Then $\|s\|^{(j)}$ is the weight (or, similarly, checksum) of the j-th iteration (the current iteration).

At operation 606, the system determines whether the syndrome at the current iteration is zero or not. For example, if the weight is zero, the system determines that the syndrome is zero. Otherwise, the system determines that the syndrome is non-zero. If the syndrome is zero, operation 618 is performed after operation 606 and the system terminates the iterative decoding at the current iteration and outputs the decoded codeword. Otherwise, operation 608 is performed after operation 606 such that the system checks whether other parameters of the early termination rule are satisfied to support the early termination or not.

At operation 608, the system determines the number of iterations that corresponds to the current iteration. For example, each time the system completes a decoding iteration, the system increases the iteration counter by one. Accordingly, the number of iterations performed so far and corresponding to the current iteration is determined from the current value of the iteration counter.

At operation 610, the system determines whether the number of iterations corresponding to the current iteration is equal to or larger than an iteration number threshold and is smaller than the maximum number of iterations. For example, the system compares the current value of the iteration counter to the iteration number of threshold. If the current value is equal to or greater than the iteration number of threshold, the system determines that the number of iterations reached the iteration number threshold. In this case, operation 612 is performed after operation 610, where the system further assesses if the iterative decoding should be terminated early. Otherwise, operation 614 is performed after operation 610, where the system continues the iterative decoding.

At operation 612, the system compares the syndrome at the current number of iterations to a checksum threshold. At this operation, the syndrome is non-zero. Generally, the comparing indicates whether the likelihood of correcting all the errors of the codeword is low even if the maximum number of iterations is performed. If so, the system can generate a decision for the early termination of the iterative decoding (as illustrated in connection with operation 618).

Various types of the comparison are possible. The example flow 600 is illustrated in connection with comparing the weight of the syndrome (e.g., $\|s\|$) to the checksum threshold. Other types of the comparison are possible. Example flow 700 of FIG. 7 illustrates a comparison based on a change to the weight of the syndrome between iterations. As further described in connection with FIG. 7, the checksum threshold includes a rate change threshold for comparison with the change to the weight.

In the example flow 600, the system compares the weight of the syndrome to the checksum threshold. If the weight is equal to or greater than the checksum threshold, the system generates a decision for the early termination of the iterative decoding. Accordingly, operation 618 is performed after operation 612, where the system terminates the iterative decoding and outputs the decoded codeword. Otherwise, operation 614 is performed after operation 612.

At operation 614, the system continues the iterative decoding. For example, the system proceeds with decoding the LDPC codeword in the next decoding iteration and increments the iteration counter by one.

At operation 616, the system compares the number of the iterations corresponding to the current iteration (e.g., the current value of the iteration counter) to the maximum number of iterations. If this number is equal to or greater than the maximum number of iterations, operation 618 is performed after operation 616, where the system terminates the iterative decoding and outputs the decoded codeword. Otherwise, operation 604 is performed after operation 614, where the system loops back and computes the syndrome.

As illustrated in the example flow 600 of FIG. 6, operation 612 (where the syndrome is compared to the checksum threshold, such as by comparing the syndrome's weight or the decoded codeword's checksum to the checksum threshold) only after operation 610 indicates that the current number of iterations reaches the iteration number threshold, but prior to the current number of iterations reaching the maximum number of iterations. In this way, the system ensures that at least a minimum number of decoding iterations has been performed to build confidence in the iterative decoding and avoids a premature termination.

FIG. 7 illustrates an example flow for using the syndrome at the current iteration to generate a decision for an early termination of an LDPC iterative decoding, in accordance with certain embodiments of the present disclosure. Some or all of the operations of example flow 700 may be implemented as sub-operations of operations 504 and 506 of the example flow 500 of FIG. 5. Relative to the example flow 600 of FIG. 6, the example flow 700 represents the use of the change to the weight of the system as a parameter for the early termination.

As illustrated, the example flow 700 starts at operation 702, where the system initiates the iterative decoding. At operation 704, the system determines the change to the weight of the syndrome at a current decoding iteration. For example, the system computes the syndrome and its weight at each decoding iteration and monitors the change to weight between the iterations.

At operation 706, the system determines whether the change is acceptable. This determination is typically performed only after the current number of iterations reaches the iteration number threshold to avoid a premature early termination. Various types of determination are possible. In one example, the system uses a change rate threshold. In this example, the system computes a rate of the change to the weight of the syndrome from one or more previous iterations to the current iteration. The system compares the rate of change to the change rate threshold. If the rate of change is lower than the change rate threshold, the system generates a decision to terminate the iterative decoding because the rate of change is unacceptable. Otherwise, such a decision is not generated.

In another example, the system does not use a change rate threshold. Instead, the system computes the change to the weight of the syndrome from one or more previous iterations to the current iteration. The system then determines whether the rate of the change is constant, has not improved, has worsened, or is relatively stable from the one or more previous iterations. If so, the system generates the decision to terminate the iterative decoding because the rate of change is unacceptable. Otherwise, this decision is not generated.

At operation 708, the system terminates the iterative decoding based on an early termination rule. In this example, the rule specifies that if the change to the weight of syndrome was found unacceptable at operation 706 (and, thus, a decision for the early termination was generated), the system should terminate the iterative decoding at the current iteration. Accordingly, the system exits the iterative decoding and outputs the decoded codeword.

As previously described, a combination of using the comparison of the weight of the syndrome to the checksum threshold, similarly to what is illustrated in the example flow 600 of FIG. 6, and monitoring the rate of change to the weight between decoding iterations, similarly to what is illustrated in the example flow 700 of FIG. 7, is possible. For example, and referring back to operation 612 of the example flow 600, the system determines that the weight of the syndrome at the current iteration is equal to or greater than the checksum threshold. Rather than generating a decision to terminate the iterative decoding, the system further investigates whether the likelihood of correcting all the errors of the codeword is low even if the maximum number of iterations is performed. In this case, instead of performing operation 618 after the operation 612, the system performs operations similar to operations 704-708 of the example flow 700. In one specific example, the system determines the rate of change to the weight from a number of previous iterations to the current iteration (e.g., from the last five iterations) to generate the decision for the early termination as applicable. In another specific example, the system starts monitoring the rate of change to the weight from the current iteration to a number of subsequent iterations but prior to the iteration counter reaching the maximum number of iterations (e.g., over the next five iterations) to generate the decision for the early termination as applicable.

Figure 8:
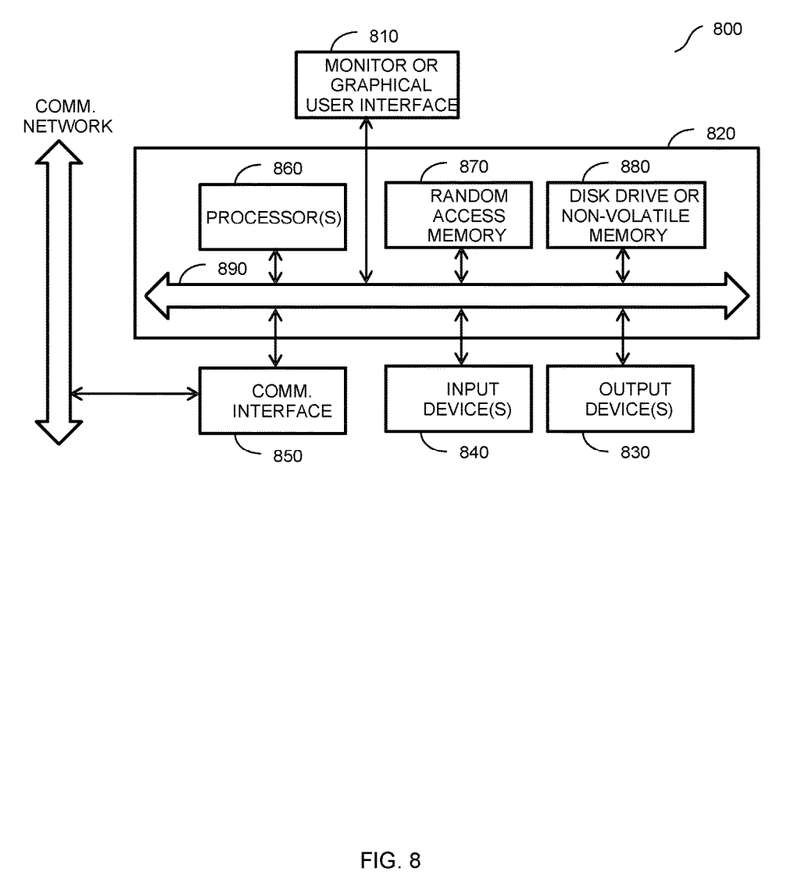
FIG. 8 is representative of a computer system capable of embodying the present disclosure.

FIG. 8 describes one potential implementation of a system, which may be used according to one embodiment, such as the error correction system 100 of FIG. 1. FIG. 8 is merely illustrative of an embodiment of the present disclosure and does not limit the scope of the disclosure as recited in the claims. In one embodiment, the system is a computer system 800 that typically includes a monitor 810, a computer 820, user output devices 830, user input devices 840, communications interface 850, and the like. The error correction system 100 of FIG. 1 implements some or all of the components of the computer system 800.

As shown in FIG. 8, the computer 820 may include a processor(s) 860 that communicates with a number of peripheral devices via a bus subsystem 890. These peripheral devices may include the user output devices 830, the user input devices 840, the communications interface 850, and a storage subsystem, such as random access memory (RAM) 870 and disk drive 880.

The user input devices 840 include all possible types of devices and mechanisms for inputting information to the computer system 820. These may include a keyboard, a keypad, a touch screen incorporated into the display, audio input devices such as voice recognition systems, microphones, and other types of input devices. In various embodiments, the user input devices 840 are typically embodied as a computer mouse, a trackball, a track pad, a joystick, a wireless remote, a drawing tablet, a voice command system, an eye tracking system, and the like. The user input devices 840 typically allow a user to select objects, icons, text and the like that appear on the monitor 810 via a command such as a click of a button or the like.

The user output devices 830 include all possible types of devices and mechanisms for outputting information from the computer 820. These may include a display (e.g., the monitor 810), non-visual displays such as audio output devices, etc.

The communications interface 850 provides an interface to other communication networks and devices. The communications interface 850 may serve as an interface for receiving data from and transmitting data to other systems. Embodiments of the communications interface 850 typically include an Ethernet card, a modem (telephone, satellite, cable, ISDN), (asynchronous) digital subscriber line (DSL) unit, FireWire interface, USB interface, and the like. For example, the communications interface 850 may be coupled to a computer network, to a FireWire bus, or the like. In other embodiments, the communications interfaces 850 may be physically integrated on the motherboard of the computer 820, and may be a software program, such as soft DSL, or the like.

In various embodiments, the computer system 800 may also include software that enables communications over a network such as the HTTP, TCP/IP, RTP/RTSP protocols, and the like. In alternative embodiments of the present disclosure, other communications software and transfer protocols may also be used, for example IPX, UDP or the like. In some embodiments, the computer 820 includes one or more Xeon microprocessors from Intel as the processor(s) 860. Further, one embodiment, the computer 820 includes a UNIX-based operating system.

The RAM 870 and the disk drive 880 are examples of tangible media configured to store data such as embodiments of the present disclosure, including executable computer code, human readable code, or the like. Other types of tangible media include floppy disks, removable hard disks, optical storage media such as CD-ROMS, DVDs and bar codes, semiconductor memories such as flash memories, non-transitory read-only-memories (ROMS), battery-backed volatile memories, networked storage devices, and the like. The RAM 870 and the disk drive 880 may be configured to store the basic programming and data constructs that provide the functionality of the present disclosure.

Software code modules and instructions that provide the functionality of the present disclosure may be stored in the RAM 870 and the disk drive 880. These software modules may be executed by the processor(s) 860. The RAM 870 and the disk drive 880 may also provide a repository for storing data used in accordance with the present disclosure.

The RAM 870 and the disk drive 880 may include a number of memories including a main random access memory (RAM) for storage of instructions and data during program execution and a read-only memory (ROM) in which fixed non-transitory instructions are stored. The RAM 870 and the disk drive 880 may include a file storage subsystem providing persistent (non-volatile) storage for program and data files. The RAM 870 and the disk drive 880 may also include removable storage systems, such as removable flash memory.

The bus subsystem 890 provides a mechanism for letting the various components and subsystems of the computer 820 communicate with each other as intended. Although the bus subsystem 890 is shown schematically as a single bus, alternative embodiments of the bus subsystem may utilize multiple busses.

FIG. 8 is representative of a computer system capable of embodying the present disclosure. It will be readily apparent to one of ordinary skill in the art that many other hardware and software configurations are suitable for use with the present disclosure. For example, the computer may be a desktop, portable, rack-mounted, or tablet configuration. Additionally, the computer may be a series of networked computers. Further, the use of other microprocessors are contemplated, such as Pentium™ or Itanium™ microprocessors; Opteron™ or AthlonXP™ microprocessors from Advanced Micro Devices, Inc., and the like. Further, other types of operating systems are contemplated, such as Windows®, WindowsXP®, WindowsNT®, or the like from Microsoft Corporation, Solaris from Sun Microsystems, LINUX, UNIX, and the like. In still other embodiments, the techniques described above may be implemented upon a chip or an auxiliary processing board.

Various embodiments of the present disclosure can be implemented in the form of logic in software or hardware or a combination of both. The logic may be stored in a computer readable or machine-readable non-transitory storage medium as a set of instructions adapted to direct a processor of a computer system to perform a set of steps disclosed in embodiments of the present disclosure. The logic may form part of a computer program product adapted to direct an information-processing device to perform a set of steps disclosed in embodiments of the present disclosure. Based on the disclosure and teachings provided herein, a person of ordinary skill in the art will appreciate other ways and/or methods to implement the present disclosure.

The data structures and code described herein may be partially or fully stored on a computer-readable storage medium and/or a hardware module and/or hardware apparatus. A computer-readable storage medium includes, but is not limited to, volatile memory, non-volatile memory, magnetic and optical storage devices such as disk drives, magnetic tape, CDs (compact discs), DVDs (digital versatile discs or digital video discs), or other media, now known or later developed, that are capable of storing code and/or data. Hardware modules or apparatuses described herein include, but are not limited to, application-specific integrated circuits (ASICs), field-programmable gate arrays (FPGAs), dedicated or shared processors, and/or other hardware modules or apparatuses now known or later developed.

The methods and processes described herein may be partially or fully embodied as code and/or data stored in a computer-readable storage medium or device, so that when a computer system reads and executes the code and/or data, the computer system performs the associated methods and processes. The methods and processes may also be partially or fully embodied in hardware modules or apparatuses, so that when the hardware modules or apparatuses are activated, they perform the associated methods and processes.

The methods and processes disclosed herein may be embodied using a combination of code, data, and hardware modules or apparatuses.

Although the foregoing embodiments have been described in some detail for purposes of clarity of understanding, the disclosure is not limited to the details provided. There are many alternative ways of implementing the disclosure. The disclosed embodiments are illustrative and not restrictive.

What is claimed is:

1. A method of decoding a low-density parity-check (LDPC) code from a computer memory, the method comprising:
   initiating, by a system that comprises an LDPC decoder, an iterative decoding of an LDPC codeword, wherein the iterative decoding is bounded by a maximum number of iterations;
   determining, by the system, that a current iteration of the iterative decoding corresponds to a current number of iterations that is equal to or greater than an iteration number threshold and is smaller than the maximum number of iterations;
   comparing, by the system when the current number of iterations is equal to or greater than the iteration number threshold, a syndrome associated with the LDPC codeword at the current number of iterations to a checksum threshold, wherein the syndrome is non-zero; and
   terminating, by the system, the iterative decoding when the comparing indicates that the syndrome is equal to or greater than the checksum threshold, wherein the iterative decoding is terminated prior to reaching the maximum number of iterations and improves a latency performance of the computer memory based on the terminating prior to reaching the maximum number of iterations.

2. The method of claim 1, wherein the comparing compares a weight of the syndrome to the checksum threshold, wherein the weight represents a checksum of the codeword, and wherein the comparing indicates that the weight is equal to or greater than the checksum threshold, and wherein the iterative decoding is terminated at the current iteration.

3. The method of claim 1, wherein comparing the syndrome to the checksum threshold is performed only after the current number of iterations reaches the iteration number threshold.

4. The method of claim 1, wherein the iteration number threshold and the checksum syndrome are predefined based on a simulation of a latency performance of the iterative decoding.

5. The method of claim 1, wherein the maximum number of iterations is predefined from the range of fifteen to twenty-five, wherein the iteration number threshold is smaller than the maximum number of iterations and is predefined from the range of ten to twenty, and wherein the checksum threshold is predefined from the range of twenty-five to thirty-five.

6. The method of claim 1, wherein the iteration number threshold is predefined from the range of sixty to eighty percent of the maximum number of iterations.

7. The method of claim 1, further comprising:
   determining, by the system, a change to a weight of the syndrome at an iteration of the iterative decoding subsequent to the current iteration, wherein the iterative decoding is terminated based on a rule that specifies the terminating according to the change.

8. The method of claim 7, wherein the change indicates that the weight is constant or has worsened, and wherein the rule specifies the terminating at the iteration based on the weight being constant or having worsened.

9. The method of claim 7, wherein the checksum threshold is associated with a change rate, wherein the change to the weight of the syndrome indicates that the syndrome is changing at a lower rate than the change rate, and wherein the rule specifies the terminating at the iteration based on the change being at the lower rate.

10. The method of claim 1, wherein the checksum threshold is associated with a change rate threshold, wherein comparing the syndrome to the checksum threshold comprises comparing a change to a weight of the syndrome to the change rate threshold by at least:
    computing a rate of the change to the weight of the syndrome from one or more previous iterations to the current iteration;
    determining that the rate of change to the weight of the syndrome is lower than the change rate threshold; and
    generating a decision to terminate the iterative decoding based on the rate of change being lower than the change rate threshold.

11. The method of claim 1, wherein comparing the syndrome to the checksum threshold comprises:
    computing a rate of change to a weight of the syndrome from one or more previous iterations to the current iteration;
    determining that the rate of change to the weight of the syndrome is constant or has not improved from the one or more previous iterations; and
    generating a decision to terminate the iterative decoding based on the rate of change being lower than the change rate threshold.

12. A system, comprising:
    a processor; and
    a memory comprising computer-readable instructions associated with a low-density parity-check (LDPC) decoder, the instructions upon execution by the processor cause the system to at least:
        initiate an iterative decoding of an LDPC codeword, wherein the iterative decoding is bounded by a maximum number of iterations;
        determine that a current iteration of the iterative decoding corresponds to a current number of iterations that is equal to or greater than an iteration number threshold and is smaller than the maximum number of iterations;
        compare, when the current number of iterations is equal to or greater than the iteration number threshold, a syndrome associated with the LDPC codeword at the current number of iterations and a checksum threshold, wherein the syndrome is non-zero; and
        terminate the iterative decoding when the comparing indicates that the syndrome is equal to or greater than the checksum threshold, wherein the iterative decoding is terminated prior to reaching the maximum number of iterations and improves a latency performance of the memory based on the terminating prior to reaching the maximum number of iterations.

13. The system of claim 12, wherein the comparison indicates that a weight of the syndrome associated with the LDPC codeword is equal to or greater than the checksum threshold, and wherein the iterative decoding is terminated at the current iteration.

14. The system of claim 12, wherein comparing the syndrome and the checksum threshold comprises comparing a checksum of the codeword to the checksum threshold, wherein the checksum and the checksum threshold are compared only after the current number of iterations reaches the iteration number threshold.

15. The system of claim 12, wherein the checksum threshold is associated with a change rate threshold, wherein comparing the syndrome and the checksum threshold comprises:
computing a rate of change to a weight of the syndrome from one or more previous iterations to the current iteration;
determining that the rate of change to the weight of the syndrome is lower than the change rate threshold; and
generating a decision to terminate the iterative decoding based on the rate of change being lower than the change rate threshold.

16. The system of claim 12, wherein the iteration number threshold is predefined from the range of sixty to eighty percent of the maximum number of iterations, and wherein the rate of change to the syndrome is computed only after the current number of iterations reaches the iteration number threshold.

17. The system of claim 12, wherein comparing the syndrome to the checksum threshold comprises:
computing a rate of change to weight of the syndrome from one or more previous iterations to the current iteration;
determining that the rate of change to the weight of the syndrome is constant or has not improved from the one or more previous iterations; and
generating a decision to terminate the iterative decoding based on the rate of change being lower than the change rate threshold.

18. A non-transitory computer storage medium storing instructions that are associated with a low-density parity-check (LDPC) decoder and that, upon execution by a processor of a system, cause the system to perform operations comprising:
initiating an iterative decoding of an LDPC codeword, wherein the iterative decoding is bounded by a maximum number of iterations;
determining that a current iteration of the iterative decoding corresponds to a current number of iterations that is equal to or greater than an iteration number threshold and is smaller than the maximum number of iterations;
comparing, when the current number of iterations is equal to or greater than the iteration number threshold, a syndrome associated with the LDPC codeword at the current number of iterations and a checksum threshold, wherein the syndrome is non-zero; and
terminating the iterative decoding when the comparing indicates that the syndrome is equal to or greater than the checksum threshold, wherein the iterative decoding is terminated prior to reaching the maximum number of iterations.

19. The non-transitory computer storage medium of claim 18, wherein the comparing indicates that a weight of the syndrome associated with the LDPC codeword is equal to or greater than the checksum threshold, and wherein the iterative decoding is terminated at the current iteration.

20. The non-transitory computer storage medium of claim 18, wherein the checksum threshold is associated with a change rate threshold, wherein comparing the syndrome and the checksum threshold comprises:
upon the current number of iterations reaching the iteration number threshold, computing a rate of change to a weight of the syndrome from one or more previous iterations to the current iteration;
determining that the rate of change to the weight of the syndrome is lower than the change rate threshold; and
generating a decision to terminate the iterative decoding based on the rate of change being lower than the change rate threshold.

* * * * *